United States Patent
Richter et al.

(10) Patent No.: US 8,890,413 B2
(45) Date of Patent: Nov. 18, 2014

(54) IGNITION CIRCUIT FOR IGNITING A PLASMA FED WITH ALTERNATING POWER

(71) Applicant: Huettinger Elektronik GmbH + Co. KG, Freiburg (DE)

(72) Inventors: Ulrich Richter, Freiburg (DE); Gerhard Zaehringer, Freiburg (DE); Peter Wiedemuth, Herbolzheim (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 13/752,489

(22) Filed: Jan. 29, 2013

(65) Prior Publication Data
US 2013/0187545 A1    Jul. 25, 2013

Related U.S. Application Data

(63) Continuation of application No. PCT/EP2011/062365, filed on Jul. 19, 2011.

(60) Provisional application No. 61/368,777, filed on Jul. 29, 2010.

(30) Foreign Application Priority Data

Jul. 29, 2010  (DE) .................. 10 2010 038 605

(51) Int. Cl.
| | |
|---|---|
| *H01J 7/24* | (2006.01) |
| *H01J 17/26* | (2012.01) |
| *H01J 61/28* | (2006.01) |
| *H05B 31/26* | (2006.01) |
| *H01J 37/32* | (2006.01) |
| *H05H 1/46* | (2006.01) |
| *H02M 7/06* | (2006.01) |
| *H05H 1/24* | (2006.01) |
| *H05B 41/04* | (2006.01) |

(52) U.S. Cl.
CPC ............ *H05H 1/24* (2013.01); *H01J 37/32036* (2013.01); *H05H 1/46* (2013.01); *H02M 7/06* (2013.01); *H01J 37/32045* (2013.01); *H05B 41/042* (2013.01); *H05H 2001/4682* (2013.01)
USPC .................. 315/111.21; 315/352; 313/231.31

(58) Field of Classification Search
USPC .......................... 315/111.21, 352; 313/231.31
See application file for complete search history.

(56) References Cited

U.S. PATENT DOCUMENTS

| | | |
|---|---|---|
| 4,645,981 A | 2/1987 | Stramke |
| 5,399,252 A | 3/1995 | Scherer et al. |

(Continued)

FOREIGN PATENT DOCUMENTS

| | | |
|---|---|---|
| DE | 3322341 A1 | 1/1985 |
| DE | 4327517 A1 | 5/1994 |

(Continued)

OTHER PUBLICATIONS

Notification Concerning Transmittal of International Preliminary Report on Patentability for PCT Application No. PCT/EP2011/062365, mailed Feb. 7, 2013, 6 pages.

(Continued)

*Primary Examiner* — Dylan White
(74) *Attorney, Agent, or Firm* — Fish & Richardson P.C.

(57) ABSTRACT

In an ignition circuit for igniting a plasma fed with alternating power in a gas discharge chamber, having two line sections for connection to an alternating power source and at least one line section for connection to a housing earth of the gas discharge chamber, at least one series connection of a non-linear element and an energy store is connected between the line sections for connection to an alternating power source, and the line section for connection to a housing earth of the gas discharge chamber is connected to a connection node between an energy store and a non-linear element.

15 Claims, 4 Drawing Sheets

(56) References Cited

U.S. PATENT DOCUMENTS

| | | | |
|---|---|---|---|
| 5,828,175 A * | 10/1998 | Straemke | 315/111.21 |
| 6,582,566 B2 | 6/2003 | List et al. | |
| 7,241,360 B2 * | 7/2007 | Shabalin et al. | 156/345.39 |
| 2003/0196602 A1 * | 10/2003 | Shabalin et al. | 118/723 FI |
| 2008/0286496 A1 * | 11/2008 | Ramm et al. | 427/580 |
| 2013/0134890 A1 * | 5/2013 | Richter | 315/200 R |

FOREIGN PATENT DOCUMENTS

| | | |
|---|---|---|
| DE | 19842945 C1 | 3/2000 |
| DE | 19937859 A1 | 3/2001 |
| WO | WO03105543 A2 | 12/2003 |
| WO | WO2005010228 A2 | 2/2005 |

OTHER PUBLICATIONS

Notification of Transmittal of the International Search Report and the Written Opinion in the International Search Authority from corresponding PCT Application No. PCT/EP2011/062365, mailed May 29, 2012, 9 pages.

* cited by examiner

IGNITION CIRCUIT FOR IGNITING A PLASMA FED WITH ALTERNATING POWER

CROSS REFERENCE TO RELATED APPLICATIONS

This application is a continuation of and claims priority under 35 U.S.C. §120 to PCT Application No. PCT/EP2011/062365 filed on Jul. 19, 2011, which claimed priority to German Application No. 10 2010 038 605.7 filed on Jul. 29, 2010, and U.S. Application Ser. No. 61/368,777, filed Jul. 29, 2010. The contents of all of these priority applications are hereby incorporated by reference in their entirety.

TECHNICAL FIELD

This specification relates to an ignition circuit for igniting a plasma fed with alternating power in a gas discharge chamber.

BACKGROUND

In some semiconductor production processes or glass-coating processes, a plasma of positive and negative ions is generated in a gas discharge chamber, for example to apply layers or to etch. During the production process, the plasma repeatedly extinguishes and is then re-ignited, especially when new substrates are introduced into the plasma chamber. In some processes, especially those in which several process steps are performed on a substrate, the plasma is repeatedly extinguished and then re-ignited. In addition, it may be that the plasma extinguishes by itself, especially under unstable process conditions. That also makes re-ignition of the plasma necessary. In some cases, plasmas have a lower operating voltage than ignition voltage. To ignite the plasma, therefore, it is necessary for a threshold to be exceeded at the beginning. That may be accomplished, for example, by using a more powerful plasma generator (power supply).

SUMMARY

This specification discloses a method for igniting a plasma and an ignition circuit with which a plasma may occur without the use of an additional, more powerful plasma generator. That object is attained by an ignition circuit for igniting a plasma fed with an alternating power in a gas discharge chamber, having two line sections for connection to an alternating power source and at least one line section for connection to a housing ground of the gas discharge chamber, wherein at least one series connection of a non-linear element and an energy store is connected between the line sections for connection to an alternating power source and wherein the line section for connection to a housing ground of the gas discharge chamber is connected to a connection node between an energy store and a non-linear element. By means of that measure, the potential of at least one electrode of the gas discharge chamber, which electrode is connected to the alternating power source, can be shifted towards ground with the result that a higher voltage than the peak voltage of the alternating power source is applied in the plasma chamber. The ignition voltage is accordingly applied between an electrode of the gas discharge chamber and the housing of the gas discharge chamber or a ground potential. It is possible for a plurality of series connections of non-linear element and energy store to be provided. The connection node that is connected to the housing ground does not necessarily have to be the connection node of that series connection which is connected to the line sections for connection to an alternating power source. Preferably, the connection node of that/those series connection(s) which is/are closest to the gas discharge chamber and furthest from the line sections for connection to an alternating power source is connected to the line section for connection to a housing ground of the gas discharge chamber. With every added series connection, the voltage at the connection node between energy store and non-linear element can be increased further. Preferably, the connection node of that/those series connection(s) which has/have the highest voltage is connected to the line section for connection to a housing ground of the gas discharge chamber.

The ignition circuit may be a component part of an alternating power source. Alternatively, the ignition circuit may be a separate device connected by two line sections to the outputs of the alternating power source and by one line section to the gas discharge chamber, which is connected to the housing ground, or to a ground potential point to which the gas discharge chamber is connected. In particular, the ignition circuit does not need to have a line section connected to an electrode of the gas discharge chamber. The ignition circuit may be arranged in this case on the alternating power source side or on the gas discharge chamber side.

An especially simple configuration of an energy store is obtained if it is in the form of a capacitor.

The non-linear element may be a passive component or a self-controlling component. The use of a passive component has the advantage that no driving circuit is required for the non-linear element. By means of the non-linear element it is possible to prevent the energy store from discharging automatically. A self-controlling component that comes into consideration is, for example, a transistor whose output is fed back to its control input. In that case also, no separate driving circuit is necessary.

One particularly simple configuration of a passive non-linear element that comes into consideration is a diode. In that case, in particular, the cathode of the diode may be connected to the energy store. A flowing-back of charge and hence of energy stored in the capacitor can thereby be avoided.

The line section for connection to the housing ground of the gas discharge chamber may be connected to the connection node via at least one non-linear component, especially a diode. Preferably, the cathode of the diode is arranged on the gas discharge chamber side. Alternatively or in addition, the line section for connection to the housing ground of the gas discharge chamber may be connected to the connection node via at least one resistor.

An even higher ignition voltage can be obtained if a plurality of series connections, each comprising at least one non-linear element and at least one energy store, are provided. In that manner it is possible to ensure reliable ignition of the plasma.

An even higher ignition voltage can be provided if the ignition circuit has a voltage multiplier whose generated output voltage is applied between at least one electrode and the housing ground to ignite the plasma. The voltage multiplier can have a plurality of cascaded series connections each having at least one non-linear element and an energy store.

Particular advantages are obtained if a switch is provided in the connection between connection node and line section for connection to the housing ground of the gas discharge chamber. That switch is closed when ignition of the plasma is necessary. When the plasma has been ignited, the switch may be opened, thereby isolating the ignition circuit from the housing of the gas discharge chamber and thus deactivating it.

This specification also describes a plasma system having an alternating power source to which an ignition circuit is connected, and having a gas discharge chamber which comprises at least one electrode and to which the ignition circuit is connected. Such a plasma system may use an alternating power source capable of providing a lower output power than alternating power sources used hitherto, since the ignition circuit is capable of providing a higher ignition voltage which up to now could be provided only by the use of more powerful alternating power sources.

This specification describes a method for igniting a plasma fed with alternating power in a gas discharge chamber having at least two electrodes, in which an ignition voltage that is greater than the peak voltage of an alternating power source connected to the electrodes of the gas discharge chamber is generated between at least one electrode and a housing ground of the gas discharge chamber by means of an ignition circuit connected to an alternating power source and the gas discharge chamber. The expression "greater" or "higher" means here "greater in absolute terms" or "higher in absolute terms", i.e. a value adjusted for the sign. Accordingly, with the methods described in this specification, starting from an output voltage provided by an alternating power source and sufficient to sustain a plasma, it is possible to provide a voltage that is higher than the peak voltage of the output voltage, especially at least twice the peak voltage, so that a sufficient ignition voltage also can be made available.

The ignition voltage can be generated using at least one self-controlling or passive non linear component, especially a diode. The ignition voltage can thus be generated with few, inexpensive components. Especially when passive components are used, it is possible to save on a driving circuit.

The ignition voltage can be generated by charging an energy store via a self-controlling or passive non-linear component and connecting the connection node between that component and the energy store to the housing ground in an electrically conductive manner. Furthermore, the connection node between the component and the energy store can be connected to the housing ground by means of a further self-controlling or passive non-linear component, especially a diode. When ignition has taken place, the electrically conductive connection between the connection node and the housing ground may be opened, thereby deactivating the ignition circuit.

The method may be characterized by the fact that the ignition voltage is generated between at least one electrode and the housing ground of the gas discharge chamber. In that manner, ignition is ensured without its being necessary to alter the voltage between the electrodes.

The method may be characterized by the fact that the ignition voltage between at least one electrode and the housing ground of the gas discharge chamber rises with every half-wave of the alternating power until ignition of the plasma. By a slow rise from half-wave to half-wave it is possible to ensure safe ignition without hazardous over-voltages.

Further features and advantages of the systems and methods will be apparent from the following description of an illustrative embodiment with reference to the Figures of the drawings. The individual features may be implemented individually or a plurality thereof may be implemented in any desired combination in a variant of the invention.

A preferred illustrative embodiment is illustrated schematically in the drawings and is described hereinafter with reference to the Figures of the drawings.

DESCRIPTION OF DRAWINGS

FIG. 2b shows voltage curves at different points of the alternating power system of FIG. 2a;

FIG. 3b shows voltage curves at different points of the alternating power system of FIG. 3a;

Like reference symbols in the various drawings indicate like elements.

DETAILED DESCRIPTION

Figure 1A:
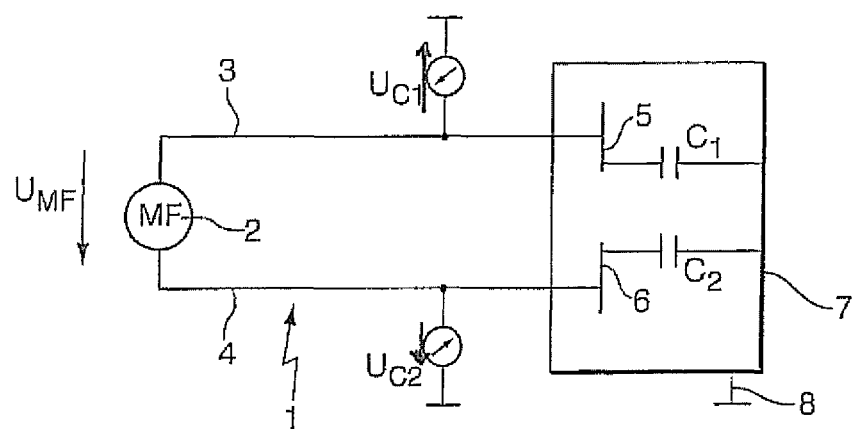
FIG. 1a is a schematic illustration of a conventional alternating power plasma system.
Figure 1B:
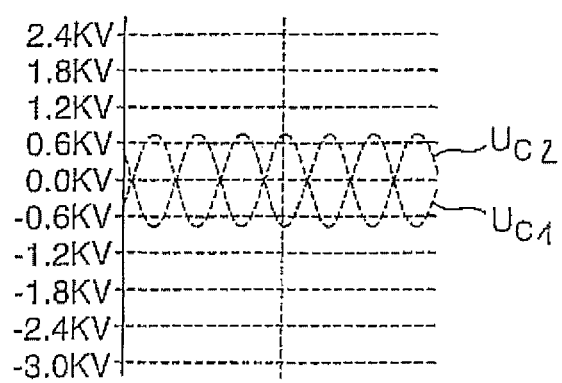
FIG. 1b shows typical voltage curves at the electrodes of an alternating power plasma system.

FIG. 1a is a simplified illustration of an alternating power plasma system 1, especially a medium-frequency plasma system. The system 1 comprises an alternating power source 2 in the form of a medium-frequency (MF) power generator which is connected by its output terminals 3, 4 to a respective electrode 5, 6 of the gas discharge chamber 7. The gas discharge chamber 7 is connected to a ground connection 8. In that manner, the housing, in particular, of the gas discharge chamber 7 is connected to ground 8. Between the electrodes 5, 6 and the housing of the plasma chamber 7 there are parasitic capacitors $C_1$, $C_2$. The voltage curves at the electrodes 5, 6 relative to ground are shown in FIG. 1b as $U_{C1}$, $U_{C2}$. Thus, $UMF=U_{C1}-U_{C2}$ where $U_{MF}$ is the output voltage of the alternating power source 2.

The voltage curves for $U_{C1}$, $U_{C2}$ are as given in FIG. 1b when $C_1$ is of the same magnitude as $C_2$, as is generally the case in a symmetrical layout. The voltages $U_{C1}$, $U_{C2}$ are not sufficient for ignition of a plasma in the gas discharge chamber 7.

Figure 2A:
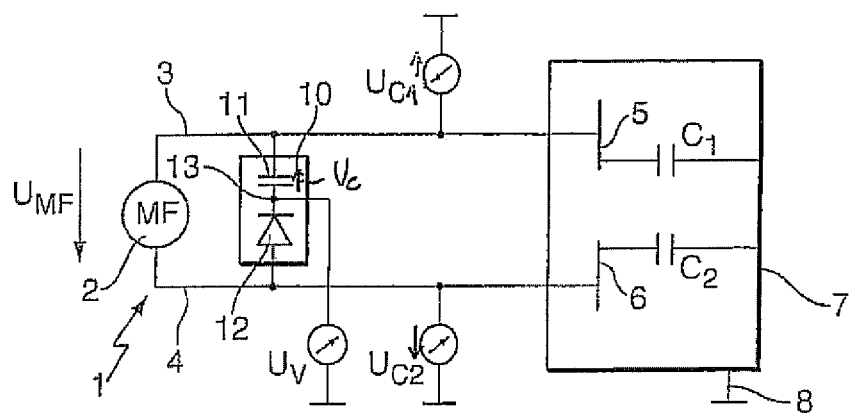
FIG. 2a is a schematic illustration of an alternating power plasma system with a circuit for generating a voltage that is greater than the output voltage of the alternating power source.
Figure 2B:
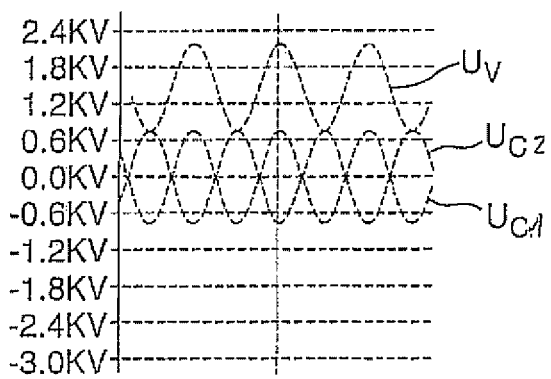

In the illustration shown in FIG. 2a, the outputs 3, 4 of the alternating power source 2 are connected via a series connection 10 of an energy store 11 in the form of a capacitor and a non-linear element 12 in the form of a diode. The series connection 10 is thus also arranged parallel to a plasma load in the gas discharge chamber 7. The voltage curve at the connection node 13 between non-linear component 12 and energy store 11 is shown in FIG. 2b as voltage $U_V$. With every negative voltage peak of the voltage $U_{MF}=U_{C1}-U_{C2}$, the capacitor 11 is charged via the diode 12 from $U_{MF}$ to the peak voltage $\hat{U}_{MF}$. The capacitor can no longer discharge and maintains a constant voltage $U_C=\hat{U}_{MF}$. The voltage $U_V$ is then given by:

$$U_V=U_C+U_{C1}=\hat{U}_{MF}+U_{C1}.$$

The voltage $U_V$ assumes values greater than the peak voltage $\hat{U}_{MF}$. The provision of the energy store assembly 13 in FIG. 2a does not yet have any effect on the voltages $U_{C1}$, $U_{C2}$. Ignition is not yet possible with this circuit arrangement.

Figure 3A:
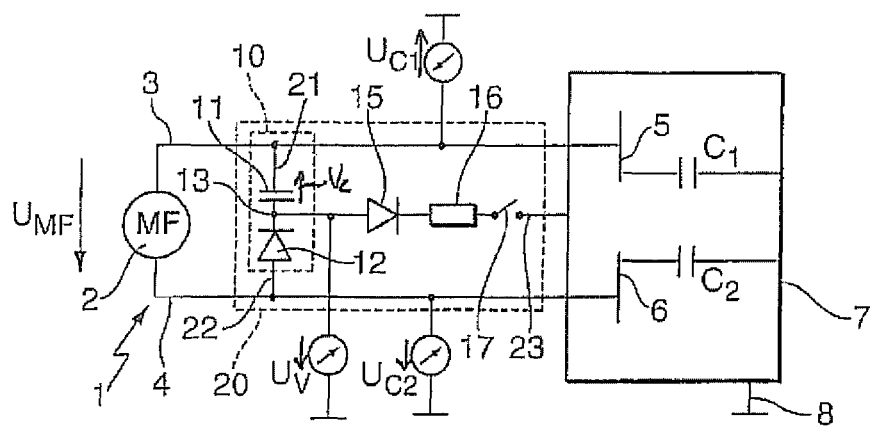
FIG. 3a is a schematic illustration of an alternating power plasma system with an ignition circuit.
Figure 3B:
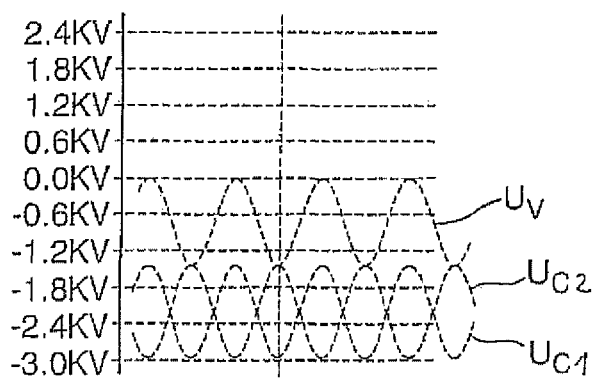

As shown in the configuration in FIG. 3a, the connection node 13 of the series connection 10 is connected to the housing of the gas discharge chamber 7, and hence to ground 8, via a series connection of non-linear component 15, in the form of a diode, and resistor 16. This means that the potential at the connection node 13 can no longer exceed the potential of the housing ground. The voltages $U_V$, $U_{C1}$ and $U_{C2}$ have thus been shifted, as can be seen from FIG. 3b. The capacitor 11 still cannot discharge. Henceforth:

$$U_{C1}=U_V-\hat{U}_{MF}$$

with $U_V$ shifted below the zero line.

There is now the greatest voltage difference of the electrodes 5, 6 relative to the housing ground of almost $2\cdot\hat{U}_{MF}$, i.e. twice the peak voltage of the alternating signal source 2. That voltage is sufficient to make ignition of a plasma possible between an electrode 5, 6 and the housing ground. By means of a switch 17 in the connection between the connection node 13 and the gas discharge chamber 7, the electrical connection of the connection node 13 to the gas discharge chamber 7 can be broken, so that the shift in the potential can be cancelled, especially when the plasma has been ignited.

Reference numeral 20 accordingly denotes an ignition circuit that has been added in comparison with the circuit of FIG. 1a. The ignition circuit 20 may be a component part of an alternating power source or may be an additional component or an additional circuit that may be added in existing alternating power systems if required. The ignition circuit 20 has line sections 21, 22 for connection to the alternating power source 2, and a line section 23 for connection to the housing ground of a gas discharge chamber 7.

When the plasma ignites, the conditions in the plasma chamber change. An electrically conductive plasma forms between the electrodes 5, 6 and the housing ground, with the result that the parasitic capacitors C1, C2 hardly have any effect any longer. The capacitor 11 is able to discharge. The ignition voltage is dissipated. That is an important advantage of this circuit, since it means that it is not necessary to open the switch 17 immediately after ignition. Sufficient time remains for the ignition to be definitely detected before the switch 17 is opened. In principle, the switch 17 is not required at all. However, a current flows via the resistor 16 for as long as there is a connection from the resistor 16 to the housing ground, with energy being uselessly converted into heat. For that reason, it is sensible to provide a switch 17 and open it when the ignition of the plasma has been definitely detected.

The speed with which the voltages $U_{C1}$ and $U_{C2}$ are shifted relative to housing ground can be adjusted by way of the resistor 16 and the capacitor 11. In particular, the speed can be selected according to the requirements of the plasma process. With a sufficiently slow rise, the plasma ignites without hazardous over-voltages being produced and without an arc immediately occurring in the plasma.

Figure 4:
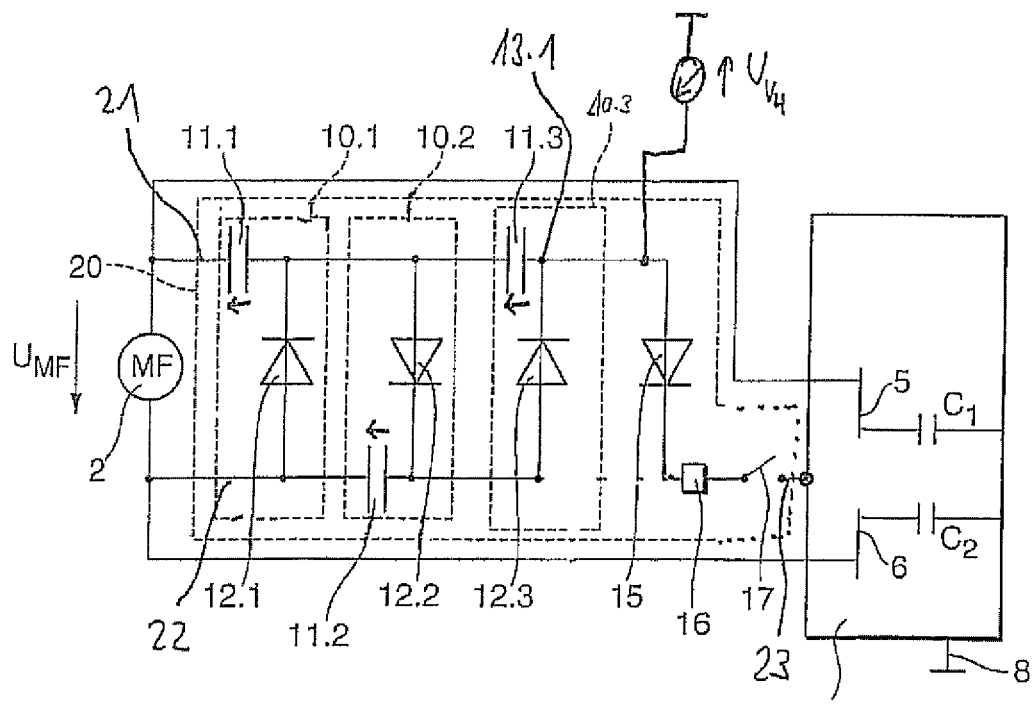
FIG. 4 shows a second embodiment of an alternating power plasma system with an ignition circuit.
Figure 5:
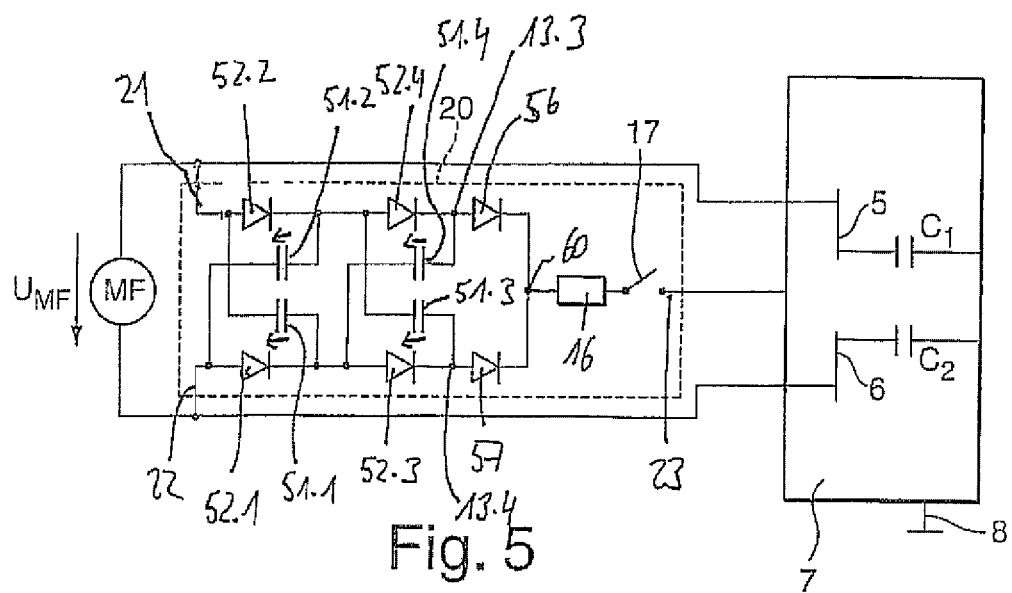
FIG. 5 shows a third embodiment of an alternating power plasma system with an ignition circuit.

In the configuration shown in FIG. 4, the ignition circuit 20 has three series connections 10.1, 10.2 and 10.3, each comprising an energy store 11.1, 11.2, 11.3 in the form of a capacitor and a non-linear element 12.1, 12.2, 12.3 in the form of a diode. The first series connection 10.1 is connected to the line sections 21, 22 for connection to the alternating power source 2, the connection node 13.1 is connected to the line section 23. In simple terms, the operation of the ignition circuit 20 may be described as follows. A first half-wave with a negative peak $-\hat{U}_{MF}$ of the output voltage $U_{MF}$ of the alternating power source 2 charges the energy store 11.1 via the non-linear element 12.1 to the peak voltage $\hat{U}_{MF}$. The arrow beside the energy store 11.1 and all further energy stores and capacitors in FIGS. 4 and 5 is intended to indicate the voltage in the energy store or capacitor in the positive direction.

There follows a half-wave with a positive peak $+\hat{U}_{MF}$. Together with the voltage of the energy store 11.1, the energy store 11.2 is now charged, via the non-linear element 12.2, to twice the voltage $2\cdot\hat{U}_{MF}$.

There follows a half-wave with a negative peak $-\hat{U}_{MF}$. Together with the voltages of the energy store 11.1 and 11.2, the capacitor 11.3 is then also charged, via the non-linear element 12.3, to twice the voltage $2\cdot\hat{U}_{MF}$.

There follows a half-wave with a positive peak $+\hat{U}_{MF}$. The voltage at the connection point 13.1 follows that polarity reversal, with the voltages at the energy stores 11.1 and 11.3 added to it. Thus, there is now a voltage at connection point 13.1 of $U_{V4}=3\cdot\hat{U}_{MF}+U_{MF}$.

In an analogous manner to the circuit in FIG. 3, that voltage is now connected via the non-linear element 15 and the resistor 16 to the housing of the gas discharge chamber 7. In that manner, there builds up a voltage of the electrodes 5, 6 relative to the housing ground 8 of up to four times the peak voltage of the output voltage.

The configuration in FIG. 5 shows an alternative configuration of an ignition circuit 20.

A first half-wave with a negative peak $-\hat{U}_{MF}$ of the output voltage $U_{MF}$ of the alternating power source 2 charges the energy store 51.1 to the output voltage $\hat{U}_{MF}$ via the non-linear element 52.1 in the form of a diode. The energy store 51.1 in the form of a capacitor and the non-linear element 52.1 in the form of a diode form a first series connection.

There follows a half-wave with a positive peak $+\hat{U}_{MF}$. With the latter, the energy store 51.2 is charged to the peak voltage $\hat{U}_{MF}$ via the non-linear element 52.2 in the form of a diode. At the same time, together with the voltage of the energy store 51.1, the energy store 51.3 is now charged to the voltage $\hat{U}_{MF}$ via the non-linear element 52.3 in the form of a diode. The energy store 51.2 in the form of a capacitor and the non-linear element 52.2 in the form of a diode and the energy store 51.3 in the form of a capacitor and the non-linear element 52.3 in the form of a diode form a series connection in each case.

There follows a half-wave with a negative peak $-U_{MF}$. Together with the voltage of the energy store 51.2, the energy store 51.4 in the form of a capacitor is now charged to the voltage $\hat{U}_{MF}$ via the non-linear element 52.4 in the form of a diode. The latter two elements also form a series connection.

At the connection points 13.3 and 13.4 there is then the voltage $U_{V13.3}$ and $U_{V13.4}$, respectively, where:

$$U_{V13.3}=2\cdot\hat{U}_{MF}+U_{MF} \text{ and } U_{V13.4}=2\cdot\hat{U}_{MF}+U_{MF}.$$

Those two voltages can be combined at a connection point 60 via a respective diode or comparable non-linear component. The connection points 13.3 and 13.4 of the series connections closest to the gas discharge chamber 7, where the highest voltage is present, are accordingly each connected to the housing of the gas discharge chamber 7 via a respective non-linear element 56, 57 and via a resistor 16 and a switch 17. In that manner, there builds up a voltage of the electrodes 5, 6 relative to the housing ground 8 of up to three times the peak voltage of the output voltage UMF. The ignition circuit 20 accordingly comprises a voltage multiplier having the components 51.1, 51.2, 51.3, 51.4, 52.1, 52.2, 52.3, 52.4.

A number of embodiments of the invention have been described. Nevertheless, it will be understood that various modifications may be made without departing from the spirit and scope of the invention. Accordingly, other embodiments are within the scope of the following claims.

What is claimed is:

1. An ignition circuit for igniting a plasma fed with alternating power in a gas discharge chamber, the ignition circuit comprising:
   two line sections for connection to an alternating power source;
   at least one series connection of a non-linear element and an energy store connected between the two line sections for connection to the alternating power source;

at least one line section for connection to a housing ground of the gas discharge chamber, the at least one line section being connected to at least one connection node between the energy store and the non-linear element; and a switch between the at least one connection node and the at least one line section for connection to the housing ground of the gas discharge chamber.

2. The ignition circuit of claim 1, wherein the at least one line section for connection to the housing ground of the gas discharge chamber is connected to the connection node via at least one resistor.

3. The ignition circuit of claim 1, further comprising a plurality of series connections, each series connection comprising at least one non-linear element and at least one energy store.

4. The ignition circuit of claim 1, further comprising a voltage multiplier.

5. A plasma system comprising:
an alternating power source;
an ignition circuit connected to the alternating power source; and
a gas discharge chamber connected to the ignition circuit;
wherein the ignition circuit comprises:
two line sections for connection to an alternating power source;
at least one series connection of a non-linear element and an energy store connected between the two line sections for connection to the alternating power source;
at least one line section for connection to a housing ground of the gas discharge chamber, the at least one line section being connected to at least one connection node between the energy store and the non-linear element; and
a switch between the at least one connection node and the at least one line section for connection to the housing ground of the gas discharge chamber.

6. The plasma system of claim 5, wherein the at least one line section for connection to the housing ground of the gas discharge chamber is connected to the connection node via at least one resistor.

7. The plasma system of claim 5, the ignition circuit further comprising a plurality of series connections, each series connection comprising at least one non-linear element and at least one energy store.

8. The plasma system of claim 5, the ignition circuit further comprising a voltage multiplier.

9. A method for igniting a plasma fed with alternating power in a gas discharge chamber comprising at least two electrodes, the method comprising: generating a power source voltage using an alternating power source comprising two output nodes, the alternating power source being connected to the two electrodes of the gas discharge chamber, the power source voltage having a peak voltage between the two output nodes that is insufficient for igniting the plasma; generating an ignition voltage that is greater than the peak voltage between the two output nodes of the alternating power source connected to the two electrodes of the gas discharge chamber using an ignition circuit connected to the alternating power source and the gas discharge chamber, the ignition voltage being sufficient to ignite the plasma; and applying the ignition voltage to at least one electrode and a housing ground of the gas discharge chamber.

10. The method of claim 9, wherein generating the ignition voltage comprises using at least self-controlling or passive non-linear component.

11. The method of claim 9, wherein generating the ignition voltage comprises charging an energy store via a self-controlling or passive non-linear component and electrically coupling a connection node between the self-controlling or passive non-linear component and the energy store to the housing ground.

12. The method of claim 11, wherein generating the ignition voltage comprises connecting the connection node between the self-controlling or passive non-linear component and the energy store to the housing ground by a further self-controlling or passive non-linear component.

13. The method of claim 11, comprising decoupling the connection node when ignition has taken place.

14. The method of claim 9, wherein the ignition voltage is generated between at least one electrode and the housing ground of the gas discharge chamber.

15. The method of claim 9, wherein the ignition voltage between at least one electrode of the gas discharge chamber and the housing ground of the gas discharge chamber rises with every half-wave of the alternating power until ignition of the plasma.

* * * * *